United States Patent [19]

Miller

[11] Patent Number: 5,032,908
[45] Date of Patent: Jul. 16, 1991

[54] HIGH DEFINITION TELEVISION ACOUSTIC CHARGE TRANSPORT FILTER BANK

[75] Inventor: Robert L. Miller, Bowie, Md.

[73] Assignee: Westinghouse Electric Corp., Pittsburgh, Pa.

[21] Appl. No.: 425,892

[22] Filed: Oct. 23, 1989

[51] Int. Cl.$^5$ .......................... H04N 7/00; H04N 7/12
[52] U.S. Cl. .................... 358/141; 358/133; 358/12
[58] Field of Search ............... 358/11, 12, 140, 141, 358/133

[56] References Cited

U.S. PATENT DOCUMENTS

| | | | |
|---|---|---|---|
| 2,686,831 | 8/1954 | Dome | 358/12 |
| 4,068,258 | 1/1978 | Bied-Charreton et al. | 358/133 |
| 4,633,285 | 12/1986 | Hunsinger et al. | 357/24 L |

OTHER PUBLICATIONS

IEEE Trans. on Acoustics, Speech and Signal Processing; "Quadrature Mirror Filter Design for an Arbitrary Number of Equal Bandwidth Channels", by Chu; vol. ASSP-33, No. 1, Feb. 1985, pp. 203-218.

"Channel Compatible 6-MHz HDTV Distribution Systems", by Schreiber et al.; SMPTE Journal, Jan. 1989, pp. 5-13.

Primary Examiner—John W. Shepperd
Attorney, Agent, or Firm—W. G. Sutcliff

[57] ABSTRACT

A high definition television acoustic charge transport filter bank significantly lowers the amount of digital processing needed in a high definition television. The filter bank effects frequency shifting by undersampling input waveforms to create aliasing, and by sampling output waveforms to shift received signals up in frequency. The filter bank is highly accurate and inexpensive because of the simple acoustic charge transport filter structure, high charge transport efficiency, linear phase and sample data operation.

17 Claims, 5 Drawing Sheets

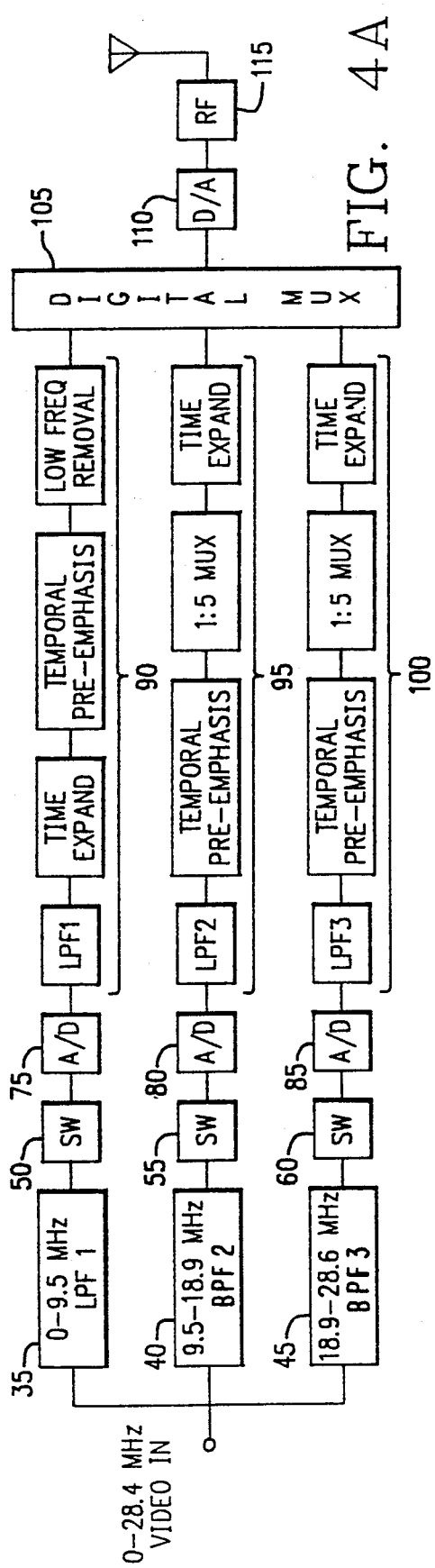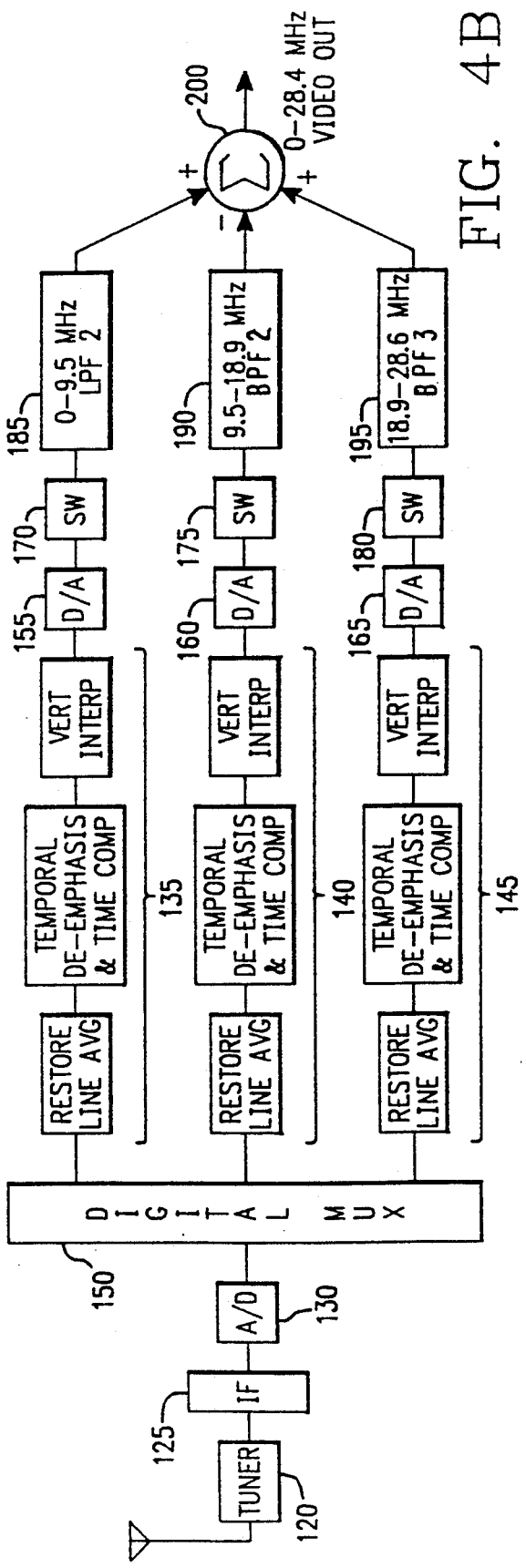

HIGH DEFINITION TELEVISION ACOUSTIC CHARGE TRANSPORT FILTER BANK

BACKGROUND OF THE INVENTION

In most communication systems, including high definition television (HDTV) modulation and filtering are essential signal processing functions. While low cost microprocessors have made digital implementations of the filtering and modulation techniques practical, the demands of communication systems designers have surpassed the capabilities of available digital technology. The present invention relates to a new analog device that compliments existing digital signal processing techniques, and more particularly, relates to an acoustic charge transport (ACT) device such as described in U.S. Pat. No. 4,633,285 which is hereby incorporated by reference.

The development of powerful, low cost and high speed microprocessors has made sophisticated digital filtering very popular. Frequently, digital filtering is more accurate, repeatable, compact and less expensive than analog versions of a given filtering technique. One example of the popularity of digital signal processing is that most of the high definition television (HDTV) systems that are currently proposed require a massive amount of digital processing in order to, e.g., rearrange picture elements and to perform bandwidth compression. The all digital HDTV system proposed by Zenith Corporation is estimated to require approximately 19.4 billion digital operations per second. This system is described in Zenith Spectrum Compatible HDTV System, Sept. 1, 1988, which is hereby incorporated by reference. It is estimated that such digital processing will remain at the outer edge of obtainability for inexpensive microprocessors, even with new development of new processors in the next few years. Such processing can be done with a number of separate processors; but, this would significantly increase the cost of digital filtering and would most likely make the resulting HDTV system too expensive to be commercially practical. In an HDTV system, the video input has a frequency range of 0–28.4 MHz. In order to satisfy the Nyquist criterion, this input signal should be sampled at two times the highest input frequency. In the proposed Zenith system, the sampling frequency is approximately 75.6 MHz. Consequently, the input filters must process samples (e.g., all 19.4 billion operations per second) in the time between the samples which arrive at a rate of 75.6 MHz. Such high processing speeds require expensive processors, and for example, expensive input analog to digital converters. For many applications, therefore, digital signal processing is simply not practical. This gives rise to a significant need for an inexpensive alternative to digital signal processing.

SUMMARY OF THE INVENTION

It is an object of the present invention to provide a low cost frequency shifting filter bank.

It is another object of the present invention to provide a frequency shifting acoustic charge transport filter bank.

It is still another object of the present invention to provide a frequency shifting acoustic transport filter bank suitable for use in HDTV.

It is a further object of the present invention to provide a simple and low cost analog alternative to digital frequency translation and filtering.

It is still a further object of the present invention to provide a means for significantly lowering the data rates through a high definition television system.

It is still another object of the present invention to provide a frequency shifting acoustic transport filter bank that can minimize the amount of digital signaling processing required in a high definition television.

In order to achieve the above and other objects, the present invention provides a high definition television acoustic charge transport (ACT) filter bank in a high definition television transmitter for transmitting a high definition television signal responsive to a high definition video signal having a frequency spectrum, comprising high definition television ACT filter means for dividing the frequency spectrum of the high definition video signal into first, second and third filtered outputs having respective center frequencies; and generating means for providing the high definition television signal in accordance with samples of the first filtered output, the second filtered output and the third filtered output by frequency shifting at least one of the first filtered output, the second filtered output and the third filtered output. The present claim also provides a high definition television ACT filter bank, wherein the generating means comprises switching means for sampling the first filtered output, the second filtered output and the third filtered output at a given rate so as to induce frequency ambiguity in the sampled first, second and third filtered outputs.

To achieve the above and other objects, the present invention also provides a method of generating a high definition television signal in a high definition television transmitter connectable to receive a high definition video signal having a frequency spectrum, comprising the steps of (a) dividing the frequency spectrum into first, second and third filtered outputs each having a respective center frequency, by applying the high definition video signal to an acoustic charge transport (ACT) filter bank; and (b) generating the high definition television signal by frequency shifting and modulating at least one of said first, second and third filtered outputs. The present invention also provides a method of receiving a high definition television signal in a high definition television receiver connectable to receive a high definition television signal having a frequency spectrum, comprising the steps of (a) detecting first, second and third filtered outputs by applying the high definition television signal to an acoustic charge transport (ACT) filter bank; and (b) providing a reproduced signal by subtracting the second filtered output from a sum of said first and third filtered outputs.

BRIEF DESCRIPTION OF THE DRAWINGS

FIGS. 4(a) and (b) are block diagrams illustrated details of signaling processing portions of the FIG. 2(a) system;

DESCRIPTION OF THE PREFERRED EMBODIMENT

Figure 1:
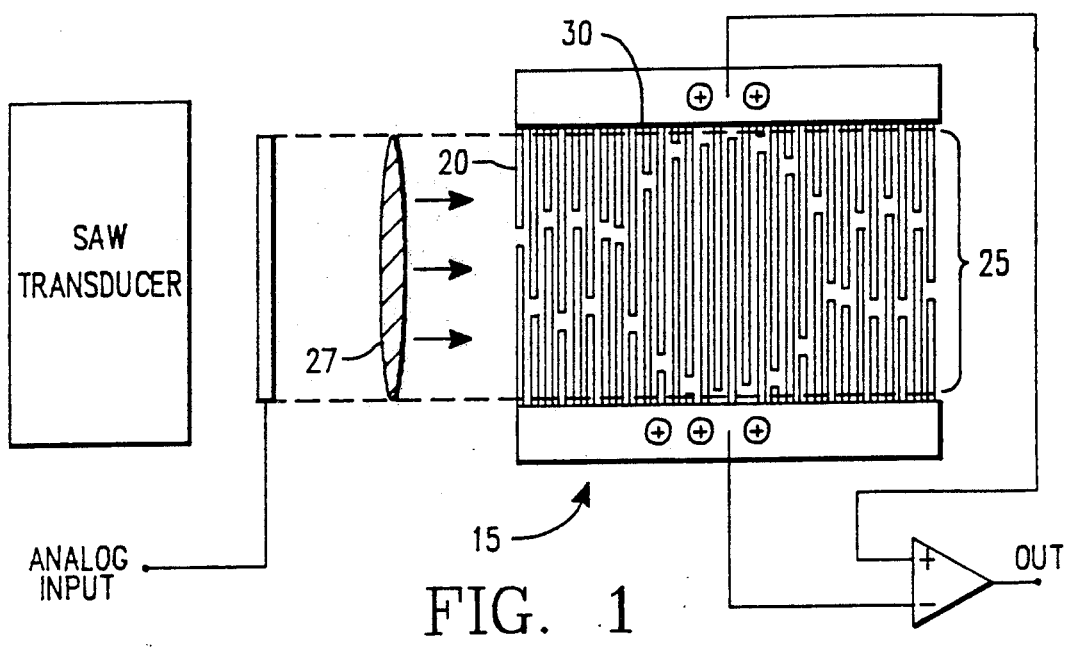
FIG. 1 is a schematic diagram of an ACT transversal filter device.

Because of their inherent sampling capabilities and wide bandwidth (e.g., d.c. to more than 300 MHz), ACT devices make excellent filters. FIG. 1 is a schematic diagram of an ACT transversal filter device 15. The filter characteristics (i.e., frequency response) of an ACT filter is determined by a non-destructive sense electrode pattern 20 formed over an ACT channel 25. The magnitude of charges in an electron packet 27 is sensed by the non-destructive sense electrode pattern 20, and sense signals are provided on busses 28 and 29. Since the sense pattern 20 is formed by common photolithography techniques, a given filter characteristic can be easily reproduced. The spacing 30 between electrodes of the sense electrode pattern 20 measured along the ACT channel determines the center frequency of the ACT filter. Changing the sense electrode pattern spacing 30 changes the center frequency of a given filter characteristic, without altering the shape of the filter characteristic. If the sense electrode pattern 20 is antisymmetrical about the center of the pattern, then the filter output will have a constant 90° phase shift with respect the filter input in addition to the linear phase slope caused by the time delay of the device. Alternatively, if the sense electrode pattern 20 is symmetrical about the center of the pattern, then it will not have the constant 90° phase shift between the filter input and output, but simply would have the linear phase slope caused by the time delay of the device. The present invention capitalizes on these features of an ACT filter.

Figure 2A:
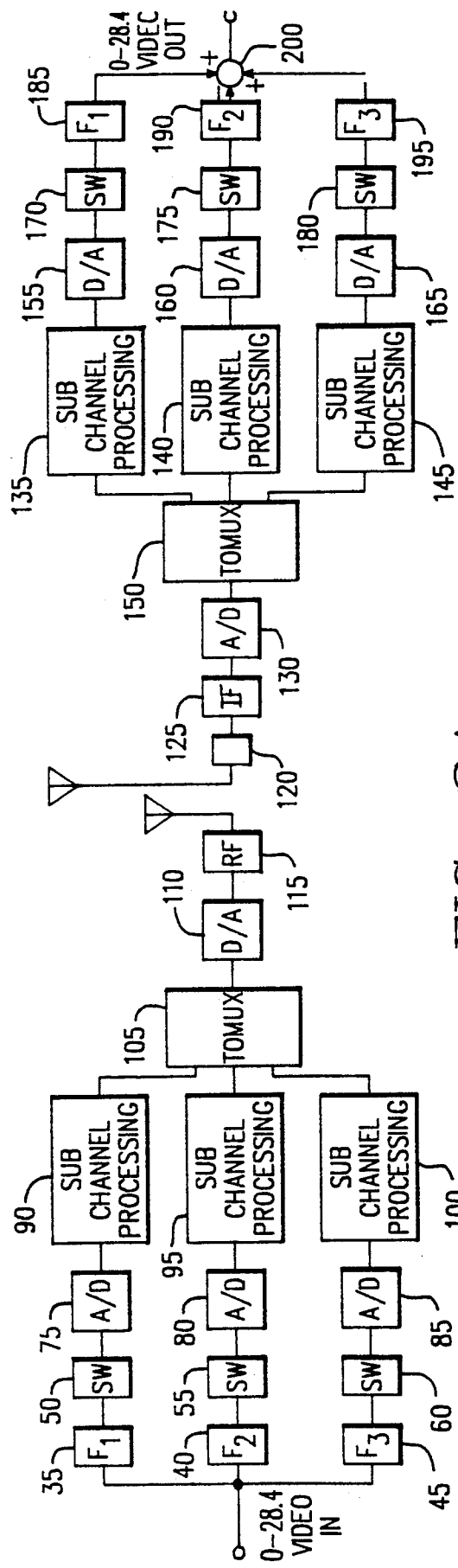
FIG. 2(a) is a block diagram of a system embodying a high definition television acoustic charge transport filter bank according to the present invention.

FIG. 2(a) is a block diagram of the high definition television acoustic charge transport filter bank of the present invention. The system shown in FIG. 2(a) performs a quadrature mirror filtering (QMF). A digital approach to implementing a QMF filter is discussed in, for example, Chu, "Quadrature Mirror Filter Design for an Arbitrary Number of Equal Bandwidth Channels," IEEE Trans. Acoust., Speech and Signal Processing, Vol. ASSP-33, No. 1, pp. 203-218 (February 1985).

Figure 2B:
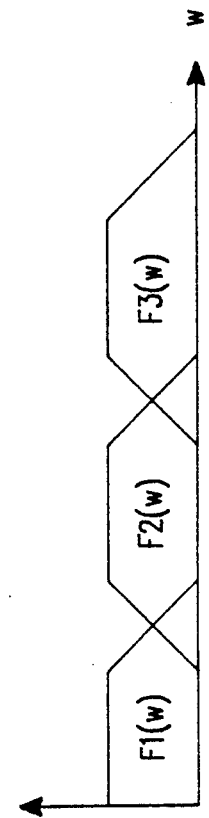
FIG. 2(b) is a graph illustrating the filter characteristics of the filters shown in FIG. 2(a)

The respective filter characteristics of the ACT filters 35, 40 and 45 are shown in FIG. 2(b) as $H_1(\omega)$, $H_2(\omega)$ and $H_3(\omega)$. As shown in FIG. 2(b), the filter characteristics for ACT filters 40 and 45 are identical except for their respective center frequencies. The filter characteristic for ACT filter 35 is the same as that for ACT filters 40 and 45 except that a filter characteristic for ACT filter 35 is a low pass filter.

The filter characteristics for ACT filters 35, 40 and 45 can be made identical by fabricating these filters with identical sense electrode patterns. The required phase shift for ACT filter 40 is obtained by offsetting the sense electrode pattern to make it antisymmetrical about the center of the pattern. Together, ACT filters 35, 40 and 45 perform the function of a high definition television ACT filter means for dividing the frequency spectrum of the high definition video signal into first, second and third filtered outputs having respective center frequencies. More particularly, the ACT filters respectively perform the functions of first, second and third ACT filter means.

Switches 50, 55 and 60 shown in FIG. 2(a) each perform a sample and hold function so that their input is sampled at, for example, ¼ the Nyquist frequency appropriate for the input. This under sampling causes aliasing which is described below with respect to FIGS. 3(a) and (b). That is, it causes frequency ambiguity in the sampled first, second and third filtered outputs.

Figure 3A:
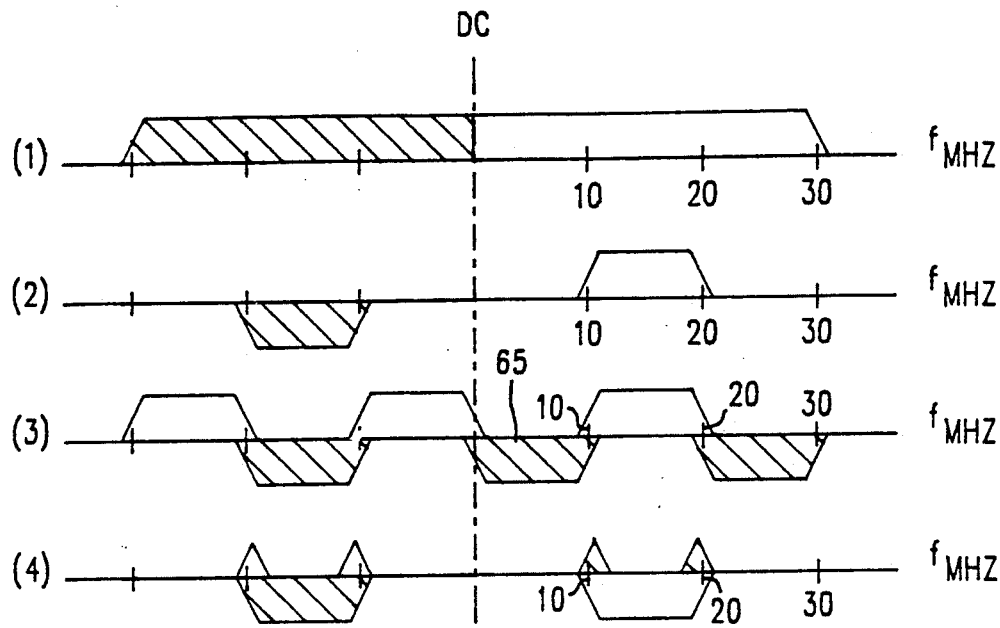
FIGS. 3(a) and 3(b) are graphs illustrating the frequency spectrum of signals appearing at various points in the FIG. 2(a) system.

Referring to FIG. 3(a), waveform (1) represents the frequency spectrum of signals applied to the FIG. 2(a) system, e.g., a high definition video input. Waveform (2) of FIG. 3(a) represents the frequency spectrum of signals output by ACT filter 40. Because ACT filter 40 introduces a phase shift 90° between its input and output, the negative frequencies shown in FIG. 3(a) have a negative amplitude. Waveform (3) of FIG. 3(a) represents the frequency spectrum of signals output by switch 55 shown in FIG. 2(a). The baseband representation of the ACT filter 40 output is represented by the black area identified by reference numeral 65. Because ACT filter 40 has a 90° phase shift, the amplitude of the baseband representation of the ACT filter 40 output has a negative amplitude.

Figure 3B:
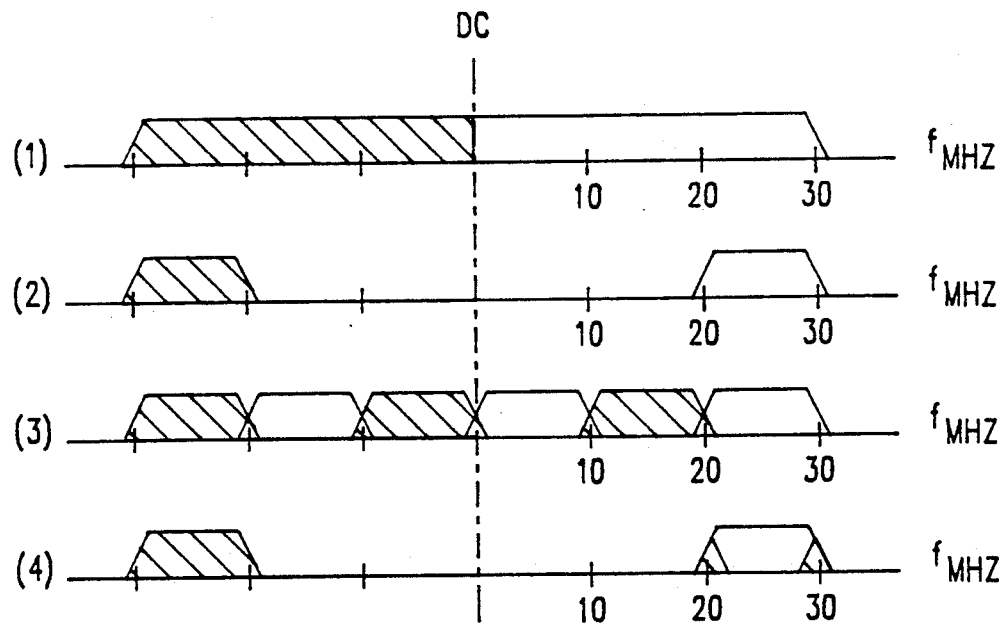

Referring to FIG. 3(b), waveform 1 represents the frequency spectrum of signals applied to the FIG. 2(a) system, e.g., a high definition video input. Waveform (2) shown in FIG. 3(b) represents the frequency spectrum of signals output by ACT filter 45. The output of ACT filter 45 is applied to switch 60 which undersamples the signal so as to create aliasing. In a preferred embodiment of the present invention, the output of the ACT filter means 45 is sampled at a rate of 18.9 MHz. Waveform (3) shown in FIG. 3(b) illustrates the frequency spectrum of signals output by the switch 60. Reference numeral 70 in waveform (3) of FIG. 3(b) identifies a baseband representation of the ACT filter 45 output.

As shown in FIG. 2(a), the respective outputs of switches 50, 55 and 60 are applied to analog to digital converters 75, 80 and 85. It will be recognized by those skilled in the art that the switch and analog to digital converter combination, such as 50 and 75, need not be separate circuits. Instead, the switches can be the sample and hold input portion of the analog to digital converters 75, 80 and 85. The respective outputs of the analog to digital converters 75, 80 and 85 are subjected to signal processing including, for example, data compression in sub-channel processing elements 90, 95 and 100 shown in FIG. 2(a). An example of signal processing performed by sub-channel processing elements 90, 95 and 100 is described in, for example, Zenith Spectrum Compatible HDTV System. The respective outputs of the sub-channel processing elements 90, 95 and 100 are applied to a multiplexer 105. The multiplexer 105 time division multiplexes the outputs of the sub-channel processing elements 90, 95 and 100. A digital to analog converter 110 converts the multiplexed digital data into analog which is then modulated and transmitted by the RF modulation unit 115.

Various types of modulation may be employed. The particular modulation utilized in the Zenith Spectrum Compatible HDTV System is quadrature amplitude modulation with suppressed sub-carrier. This type of modulation is commonly employed in communications system, and in particular, modems and the details thereof are not described here.

The switch and analog to digital converter combinations (50, 75), (55, 80), and (60, 85) function as a signal generating means that frequency shifts the filtered outputs of ACT filters (e.g., 35, 40, 45). As described above with reference to FIGS. 3(a) and 3(b), this frequency shifting effectively produces baseband versions of the outputs of ACT filters 40 and 45 due to aliasing. The ACT filters (35, 40, 45) switches (50, 55, 60) analog to digital converters (75, 80, 85), sub-channel processing elements (90, 95, 100) together with the multiplexer 105, digital to analog converter 110 and rf modulation unit 115 function as a HDTV transmitter means which provides a HDTV television signal out of the rf modulation unit 115. In the preferred embodiment, the HDTV television signal has approximately a 6 MHz bandwidth.

The 6 MHz HDTV signal is detected by a tuner 120 and converted into an IF signal by an IF stage 125. The IF signal is then converted into digital form by analog to digital converter 130. The digital signal is then time division multiplexed to the appropriate sub-channel processing element (135, 140, 145) by a time division multiplexer 150. The sub-channel processing elements (135, 140, 145) reverse the signal compression and signal processing respectively performed by sub-channel processing elements (90, 95, 100). An example of the signal processing performed by sub-channel processing elements 135, 140 and 145 is described in, for example, Zenith Spectrum Compatible HDTV System. The outputs of the sub-channel processing elements (135, 140, 145) are respectively converted to analog by digital to analog converters 155, 160, 165. In a preferred embodiment of the present invention, the outputs 25 of the digital to analog converters (155, 160, 165) are sampled/switched at a rate of 18.9 MHz. As shown in FIG. 2(a), the respective outputs of switches (170, 175, 180) are applied to ACT filters 185, 190 and 195. The switches (170, 175, 180) provide analog samples to the respective ACT filters at a rate of 18.9 MHz. This is discussed in more detail below with reference to FIG. 7. Essentially, the switches (170, 175, 180) up shift the frequency of the outputs of the digital to analog filters. The structure of the ACT filters (185, 190, 195) is the same as that of the corresponding filters (30, 40, 45) in the transmitter.

Waveforms (4) in FIGS. 3(a) and 3(b), respectively illustrate the frequency spectrum of filtered signals provided by ACT filters 190 and 195. The filtered outputs of ACT filters 185, 190 and 195 are combined in a summation circuit 200 with the signs as shown in FIG. 2(a). For example, the signal reproduced by the summation circuit 200 corresponds to a substraction of the output of ACT filter 190 from the sum of the outputs of ACT filters 185 and 195. The output of the summation circuit 200 corresponds to a reproduction of the high definition video input applied to the transmitter shown in FIG. 2(a).

The ACT filters (185, 190, 195) respectively function as ACT filter means, each having a respective center frequency and respective filter characteristic. Since the ACT filter 40 includes a phase shift of 90°, the ACT filter 190 includes a corresponding phase shift of 90°. The summation circuit 200 functions as a combining means that provides a reproduction signal that is responsive to the substraction of the output of ACT filter means 190 from the sum of the outputs of ACT filter means 185 and 195.

FIGS. 4(a) and (b) illustrate the details of the sub-channel processing elements shown in FIG. 2(a). Basically, sub-channel processing elements 90, 95 and 100 perform bandwidth compression, of the high definition television signal applied to these sub-channel processing elements, by removing detail which cannot be easily perceived by the human eye. For example, sub-channel processing element 90 passes very little vertical detail and only 0–9.6 MHz of horizontal detail. This information corresponds to the bulk of the motion detail that can be seen by the human eye. Thus, this signal is sent at the fastest rate; e.g., about 60 frames per second. Sub-channel processing element 90 also provides the remainder of the vertical detail in the 0–9.6 MHz horizontal band, but at a rate that is approximately 5 times slower, e.g., 12 frames per second.

Sub-channel processing element 95 passes horizontal detail in the range of 9.6–18.9 MHz. This horizontal information is at a lower resolution than the high rate information passed by the sub-channel processing element 90. For example, the horizontal information passed by the sub-channel processing element 95 is sent at a rate of approximately 12 frames per second.

The sub-channel processing element 100 provides the highest resolution horizontal detail in the range 18.9–28.4 MHz. This information is provided at the lowest vertical resolution and at the 12 frame per second rate. In each of the sub-channel processing elements (90, 95, 100), the low pass filters determine the amount of vertical detail; and thus, effectively reduce the amount of information passed by the respective sub-channel processing elements. The time expand block functions to change the data rate; and therefore, the bandwidth of the signal passing through the respective sub-channel processing element (90, 95, 100). The sub-channel processing elements 135, 140 and 145, respectively perform operations that are the inverse of those performed by sub-channel processing elements 90, 95 and 100. In each of the sub-channel processing elements (135, 140, 145), the function performed by the time compression block is to increase the data rate and add data samples to increase the bandwidth of the signal passed by the sub-channel processing elements.

Figure 5:
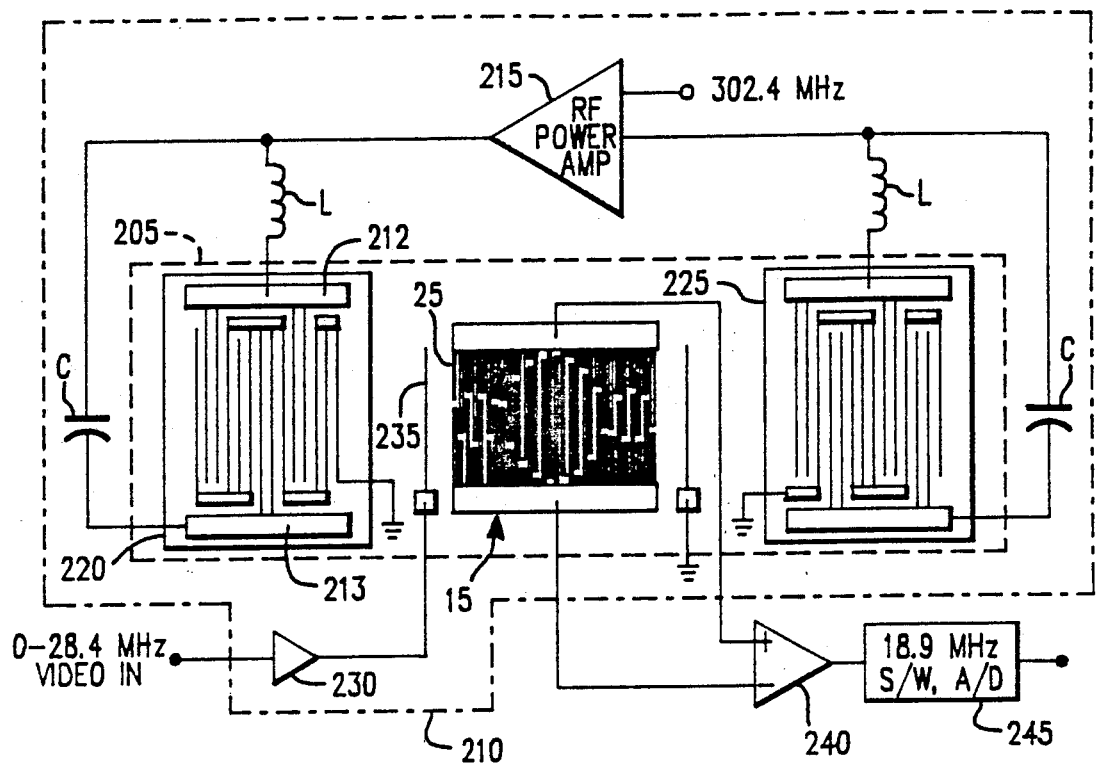
FIG. 5 is a schematic diagram of an ACT filter used in the transmitter portion of the FIG. 2(a) system.

FIG. 5 is a schematic diagram of one of the ACT filters shown in a transmitter portion of the FIG. 2(a) system. Each of the ACT filters (35, 40, 45) shown in FIG. 2(a) has the structure such as shown in FIG. 5. In the case of ACT filter 40, the sense electrodes 20 of an ACT device 205 are antisymmetrical about the center of the ACT channel 25 so as to induce a 90° phase shift between the output from and input to the ACT device 205. As shown in FIG. 5, an acoustic drive system of the ACT filter 210 is structured as a delay line with an injection lock input. In a preferred embodiment of the present invention, the frequency of the injection lock input is 302.4 MHz and ensures that the acoustic carrier wave in the ACT filter 210 runs at a frequency of 302.4 MHz. It is noted that 302.4 MHz is sixteen times the 18.9 MHz discussed earlier. These are only illustrative frequencies. The important point is that the higher frequency be an integer multiple of the lower frequency.

A power amplifier 215 drives a first SAW transducer 220 through a first LC network. The LC network provides impedance matching between the first SAW transducer 220 and the rf power amplifier 215, and ensures that the signals appearing on bus lines within the first SAW transducer have the correct phase. For example, the signals on bus 212 are shifted 90° with respect to those on bus 213.

The first SAW transducer 220 converts electrical energy from power amp 215 into acoustic energy, and launches this acoustic energy towards the channel 25 of the ACT device 205. After passing through the channel 25 of the ACT device 205, the acoustic energy is absorbed by a second SAW transducer 225. The absorbed acoustic energy is converted into electrical energy and applied to the rf power amplifier 215 through a second LC network. As with the first LC network, the second LC network serves to match the phases of the signals appearing on the buses within the second SAW transducer 225, and to provide impedance matching between the second SAW transducer 225 and the rf power amplifier 215.

An optional buffer amplifier 230 is connected to receive the 0–28.4 MHz video input and to drive an input electrode 235 of the ACT device 205. The buffer amplifier 230 provides the ACT device 205 with appropriate signal levels and compensates for the non-linear input characteristic of the ACT device 205. Basically, the buffer amplifier 230 functions as a linear voltage controlled current source with a high output impedance. The output impedance of the buffer amplifier is desirably much greater than the input impedance of the ACT device 205 so that the buffer amplifier 230 functions as a true current source.

A differential video amplifier 240 receives the outputs of the ACT device 205 e.g., sense signals. The differential video amplifier 240 can comprise any common video amplifier. The output of the differential video amplifier 240 is the amplified difference of the sense signals and is applied to a sample and hold, analog to digital converter 245. The sample and hold, analog to digital converter 245 performs the function of, for example, the switch 50 and analog to digital converter 75 shown in FIG. 2(a). Basically, the output of the differential video amplifier 240 is sampled at a rate of 18.9 MHz, and then converted to digital form for subsequent signal processing, such as the sub-channel processing performed by the sub-channel processing element 90 shown in FIG. 2(a). Together, the differential video amplifier 240 and sample and hold, analog to digital converter 245 function as a converter means for converting the sense signals to a filtered output.

Figure 6:
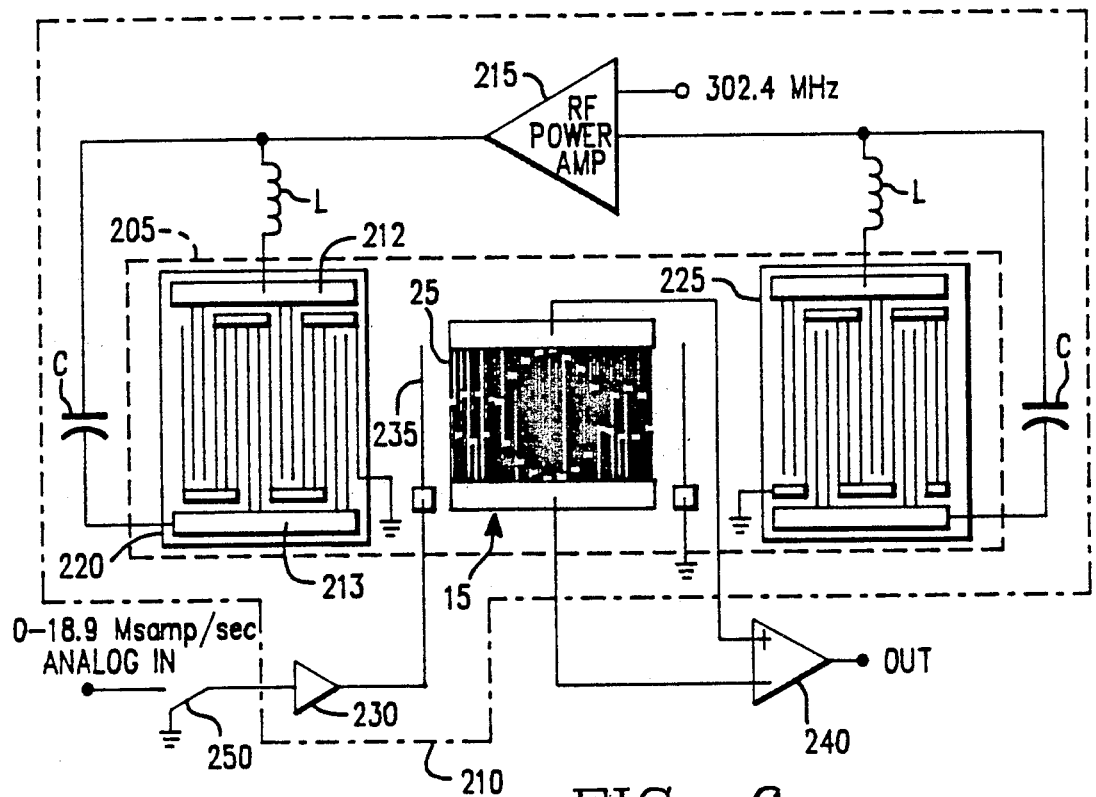
FIG. 6 is a schematic diagram of an ACT filter usable in the receiver section of the FIG. 2(a) system.

FIG. 6 is a schematic of the ACT filter 210 connected as one of the ACT filters 185, 190 and 195 shown in FIG. 2(a) of the subject application. A switch 250 samples the analog input at a rate of 18.9 MHz. The output of switch 250 is an analog pulse once every 1/18.9 MHz, or 0.0529 μs. The operation of the ACT filter 210 shown in FIG. 6 is the same as that discussed with respect to FIG. 5.

Figure 7:
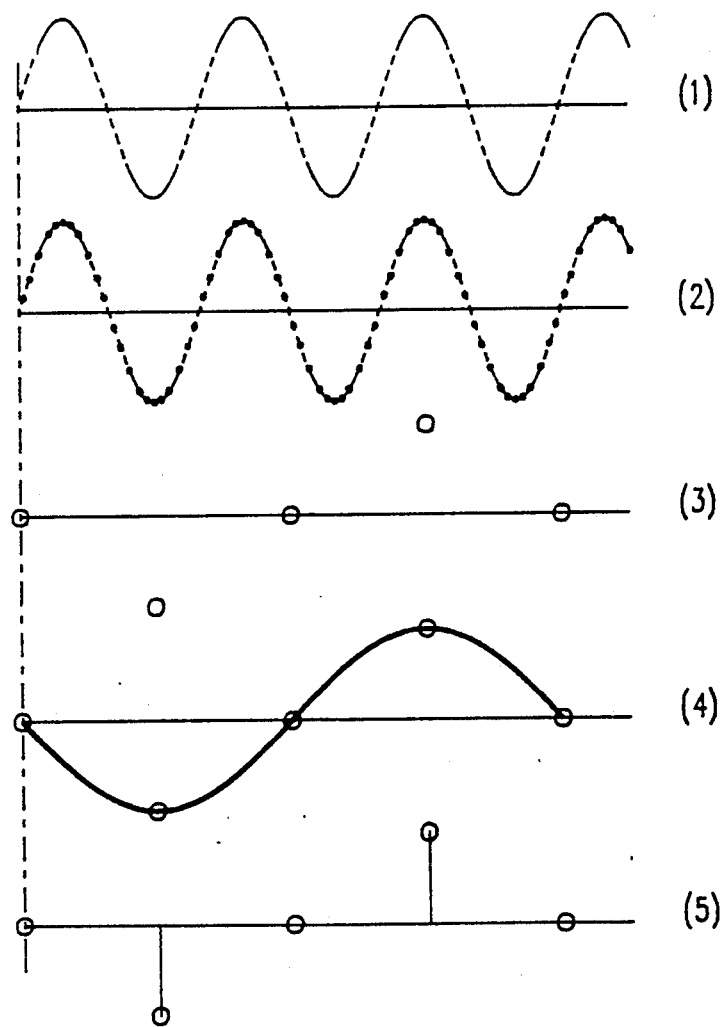
FIG. 7 is a graph illustrating waveforms appearing at various points in the FIGS. 5 and 6 ACT filters.

FIG. 7 illustrates various waveforms that appear within the circuits shown in FIGS. 2(a), 5 and 6. Waveform (1) represents a single frequency sinusoidal waveform that would be applied to the ACT device 205 via the optional buffer amplifier 230. Waveform (2) of FIG. 7 represents the input signal (waveform (1)) sampled at the 302.4 MHz rate by the ACT device 205. In other words, waveform (2) of FIG. 7 represents the output of one of the filters, e.g., 35, 40, 45 shown in FIG. 2(a). Waveform (3) shown in FIG. 7 represents the analog output of, for example, the switch 50 shown in FIG. 2(a). As seen in waveform (4) of FIG. 7, the output of the filter and switch combination (e.g., 40, 55) has a much lower frequency than the input represented by waveform (1) of FIG. 7. This illustrates the frequency translation discussed with respect to FIGS. 3(a) and (b).

After transmission and reception of the signal represented by waveform (4) of FIG. 7, this signal would appear as the analog input to switch 250 shown in FIG. 6. Switch 250 samples this input at a rate of 18.9 MHz to provide a series of impulses such as shown in waveform (5) of FIG. 7. Comparing waveforms (4) and (5) of FIG. 7, it is seen that waveform (5) has a broader and higher frequency spectrum than that of the signal represented by waveform (4). Thus, the waveform (4) has essentially been shifted up in frequency by the sampling performed by switch 250. The waveform would thus pass through the appropriate filter (185, 190, 195) shown in FIG. 2(a), be combined in summation circuit 200 and then be output as a high definition television or reproduced signal.

While the above describes the present invention with respect to a preferred embodiment, this embodiment merely illustrates the present invention and is not intended to limit the scope of the present invention. Instead, the scope of the present invention is defined by the following claims.

We claim:

1. A high definition television acoustic charge transport (ACT) filter bank in a high definition television transmitter for transmitting a high definition television signal responsive to a high definition video signal having a frequency spectrum, comprising:

high definition television ACT filter means for dividing the frequency spectrum of the high definition video signal into a plurality of filtered outputs having respective center frequencies; and generating means for providing the high definition television signal in accordance with samples of a first one of the filtered outputs, a second one of the filtered outputs and a third one of the filtered outputs by frequency shifting at least one of said first one of the filtered outputs, said second one of the filtered outputs and said third one of the filtered outputs.

2. A high definition television ACT filter bank according to claim 1, wherein said high definition television ACT filter means comprises:

first ACT filter means, having a linear phase slope and a first filter characteristic with a first center frequency, for providing the first one of the filtered outputs in accordance with the first filter characteristic and in response to the high definition video signal;

second ACT filter means, having the linear phase slope and a second filter characteristic with a second center frequency and a predetermined phase shift in addition to the linear phase slope, for providing the second one of the filtered outputs in accordance with the second filter characteristic and in response to the high definition video signal;

third ACT filter means, having the linear phase slope and a third filter characteristic with a third center frequency, for providing the third one of the filtered outputs in accordance with the third filter characteristic and in response to the video signal.

3. A high definition television ACT filter bank according to claim 2, wherein each of said first, second and third ACT filter means includes:

first ACT transversal filter means, having a channel and a non-destructive sense electrode pattern, for providing sense signals based on the video signal and the first filter characteristic;

first surface acoustic wave (SAW) transducer means for providing acoustic waves to the channel of said first ACT transversal filter means in accordance with first control signals; and wherein said generating means includes converter means for converting the sense signals to digital form and for providing the converted sense signals as a first filtered output.

4. A high definition television ACT filter bank according to claim 3, wherein said converter means comprises:

video amplifier means for providing an output based on an amplified difference of the sense signals; and analog to digital converter means for sampling the output of said video amplifier means at a given rate, for converting the samples to digital form and for providing the converted samples as the first filtered output.

5. A high definition television ACT filter bank according to claim 3, further comprising:

an RF power amplifier connected to receive an injection lock signal and to provide an amplified output based on the injection lock signal; and impedance matching means for providing said first control signals based on the amplified output of said RF power amplifier.

6. A high definition television ACT filter bank according to claim 5, further comprising:

second surface acoustic wave (SAW) transducer means for receiving acoustic waves from the channel of the first ACT transversal filter means and for providing output signals responsive to the received acoustic waves; and another impedance matching means for receiving the output signals from said second SAW transducer means and for driving said RF power amplifier based on the received acoustic waves.

7. A high definition television ACT filter bank according to claim 3, wherein said generating means comprises:

switching means for sampling said first one of the filtered outputs, said second one of the filtered outputs and said third one of the filtered outputs at a given rate so as to induce frequency ambiguity in said sampled first, second and third filtered outputs.

8. A high definition television acoustic charger transport (ACT) filter bank in a high definition television receiver connectable to receive a high definition television signal, comprising:

high definition television ACT filter means for providing a plurality of filtered outputs having respective center frequencies in response to the high definition television signal;

combining means for providing a reproduced signal responsive to a substraction of a second one of the filtered outputs from a sum of a first one of the and a third one of the filtered outputs.

9. A high definition television ACT filter bank according to claim 8, wherein said high definition television ACT filter means comprises:

first ACT filter means, having a linear phase slope and a first filter characteristic with a first center frequency, for providing a first filtered output in accordance with the first filter characteristic and in response to the high definition television signal;

second ACT filter means, having the linear phase slope and a second filter characteristic with a second center frequency and a predetermined phase shift in addition to the linear phase slope, for providing a second filtered output in accordance with the second filter characteristic and in response to the high definition television signal;

third ACT filter means, having the linear phase slope and a third filter characteristic with a third center frequency, for providing a third filtered output in accordance with the third filter characteristic and in response to the high definition television signal.

10. A high definition television ACT filter bank according to claim 9, wherein each of said first, second and third ACT filter means includes:

first ACT transversal filter means, having a channel and a non-destructive sense electrode pattern, for providing sense signals based on the high definition television signal and the first filter characteristic; and first surface acoustic wave (SAW) transducer means for providing acoustic waves to the channel of said first ACT transversal filter means in accordance with first control signals.

11. A high definition television ACT filter bank according to claim 10, further comprising:

switch means operatively connected to receive the high definition television signal and to said first ACT transversal filter means, for providing an analog pulse responsive to the high definition television signal to said first ACT transversal filter means at a predetermined rate.

12. A high definition television ACT filter bank according to claim 8, further comprising:

an RF power amplifier connected to receive an injection lock signal and to provide an amplified output based on the injection lock signal; and impedance matching means for providing said first control signals based on the amplified output of said RF power amplifier.

13. A high definition television ACT filter bank according to claim 12, further comprising:

second surface acoustic wave (SAW) transducer means for receiving acoustic waves from the channel of the first ACT transversal filter means and for providing output signals responsive to the received acoustic waves; and another impedance matching means for receiving the output signals from said second SAW transducer means and for driving said RF power amplifier based on the received acoustic waves.

14. A method of generating a high definition television signal in a high definition television transmitter connectable to receive a high definition video signal having a frequency spectrum, comprising the steps of:

(a) dividing the frequency spectrum into a plurality of filtered outputs each having a respective center frequency, by applying the high definition video signal to an acoustic charge transport (ACT) filter bank; and (b) generating the high definition television signal by frequency shifting and modulating more than one of said plurality of filtered outputs.

15. A method of generating a high definition television signal according to claim 14, wherein step (a) comprises the substeps of:

(i) generating the first filtered output by applying the high definition video signal to a first ACT filter having a linear phase slope and a first filter characteristic with a first center frequency;

(ii) generating the second filtered output by applying the high definition video signal to a second ACT filter having the linear phase slope and a second filter characteristic with a second center frequency and a predetermined phase shift in addition to the linear phase slope; and (iii) generating the third filtered output by applying the high definition video signal to a third ACT filter having the linear phase slope and a third filter characteristic with a third center frequency.

16. A method of receiving a high definition television signal having a frequency spectrum in a high definition television receiver, comprising the steps of:
   (a) detecting a plurality of filtered outputs by applying the high definition television signal to an acoustic charge transport (ACT) filter bank; and
   (b) providing a reproduced signal by subtracting a second one of the filtered outputs from a sum of a first of the and a third one of filtered outputs.

17. A method of receiving a high definition television signal according to claim 16, wherein step (a) comprises the substeps of:
   (i) generating the first filtered output by applying the high definition television signal to a first ACT filter having a linear phase slope and a first filter characteristic with a first center frequency;
   (ii) providing the second filtered output by applying the high definition television signal to a second ACT filter having the linear phase slope and a second filtered characteristic with a second center frequency and a predetermined phase shift in addition to the linear phase slope; and
   (iii) providing the third filtered output by applying the high definition television signal to a third ACT filter having the linear phase slope and a third filter characteristic with a third center frequency.

* * * * *